US 9,127,814 B2

(12) United States Patent
Nozawa

(10) Patent No.: US 9,127,814 B2
(45) Date of Patent: Sep. 8, 2015

(54) LIGHTING DEVICE, DISPLAY DEVICE, AND TELEVISION DEVICE

(75) Inventor: Shinnosuke Nozawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 185 days.

(21) Appl. No.: 13/820,577

(22) PCT Filed: Sep. 1, 2011

(86) PCT No.: PCT/JP2011/069893
§ 371 (c)(1),
(2), (4) Date: Mar. 4, 2013

(87) PCT Pub. No.: WO2012/032998
PCT Pub. Date: Mar. 15, 2012

(65) Prior Publication Data
US 2013/0162915 A1 Jun. 27, 2013

(30) Foreign Application Priority Data
Sep. 6, 2010 (JP) ................ 2010-199111

(51) Int. Cl.
G09F 13/08 (2006.01)
F21K 99/00 (2010.01)
(Continued)

(52) U.S. Cl.
CPC ............ *F21K 9/00* (2013.01); *G02F 1/133608* (2013.01); *G02F 1/133603* (2013.01); *H01L 33/486* (2013.01); *H01L 2924/0002* (2013.01)

(58) Field of Classification Search
CPC ............. G02B 19/0066; G02B 6/0088; G02F 1/133603; G02F 1/133606; G02F 1/133608; G02V 3/00; G02V 5/00; G02V 3/002; G02V 7/00; F21W 2121/00; F21W 2121/008; F21W 2121/06; F21Y 2101/02

USPC ............ 362/97.1–97.4, 249.01, 249.02, 561, 362/23.16, 23.19; 349/57, 58, 61, 62, 64, 349/65
See application file for complete search history.

(56) References Cited

U.S. PATENT DOCUMENTS 5,555,161 A * 9/1996 Roe et al. ............... 362/555
7,163,319 B2 * 1/2007 Kuo et al. ............... 362/306
(Continued)

FOREIGN PATENT DOCUMENTS

JP 01-187509 A 7/1989
JP 2003-234008 A 8/2003
(Continued)

OTHER PUBLICATIONS

Official Communication issued in International Patent Application No. PCT/JP2011/069893 mailed on Nov. 22, 2011.

*Primary Examiner* — Hargobind S Sawhney
(74) *Attorney, Agent, or Firm* — Keating & Bennett, LLP

(57) ABSTRACT

An object of this invention is to provide a lighting device in which a predetermined distance between the LED units and the optical member can be maintained without increasing the number of the parts, and to provide a display device, and a television device including the same. The lighting device includes a chassis 21, an LED unit 30, and an optical member 22. The chassis 21 houses the LED unit 30. The LED unit 30 includes an LED package 31 and a printed circuit board 32. The LED package 31 is mounted on the LED package 31. The LED package 31 includes an LED chip sealed therein and a spacer portion 37. The optical member 22 is arranged opposite the LED package 31. The spacer portion 37 is in contact with and maintains the optical member 22 having a predetermined distance away from the LED package 31.

10 Claims, 14 Drawing Sheets

(51) Int. Cl.
 *G02F 1/1335* (2006.01)
 *H01L 33/48* (2010.01)

(56) References Cited

U.S. PATENT DOCUMENTS

| | | | |
|---|---|---|---|
| 7,287,879 B2 * | 10/2007 | Hsu | 362/294 |
| 7,324,174 B2 * | 1/2008 | Hafuka et al. | 349/61 |
| 7,413,318 B2 * | 8/2008 | Hsu et al. | 362/97.1 |
| 7,604,365 B2 * | 10/2009 | Chang | 362/97.1 |
| 8,104,909 B2 * | 1/2012 | Shin | 362/97.1 |
| 8,104,911 B2 * | 1/2012 | Hillman et al. | 362/97.3 |
| 8,197,082 B2 * | 6/2012 | Cho et al. | 362/97.3 |
| 8,425,070 B2 * | 4/2013 | Shin | 362/97.3 |
| 8,459,820 B2 * | 6/2013 | Lee et al. | 362/97.4 |

FOREIGN PATENT DOCUMENTS

| | | |
|---|---|---|
| JP | 2006-120499 A | 5/2006 |
| JP | 2008-166304 A | 7/2008 |
| JP | 2010-092685 A | 4/2010 |

\* cited by examiner

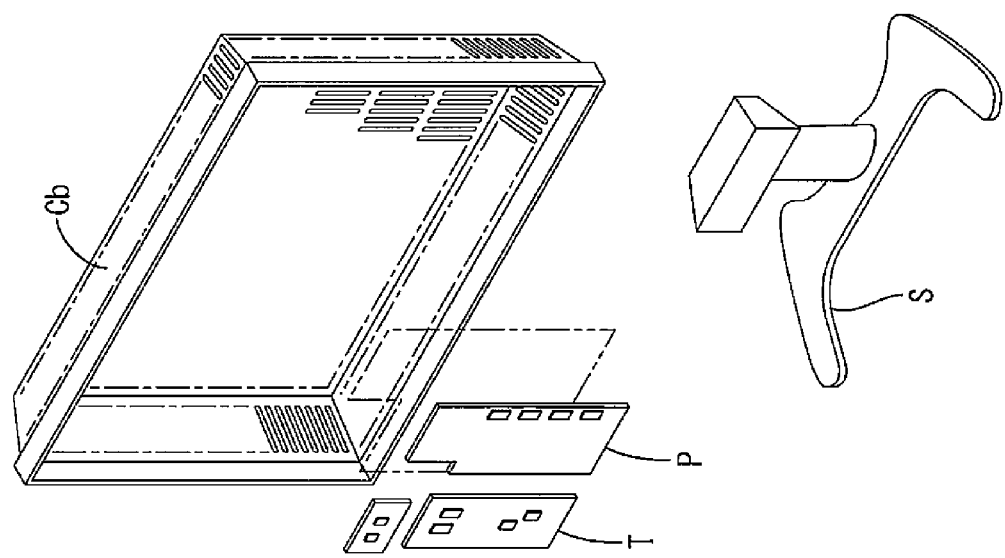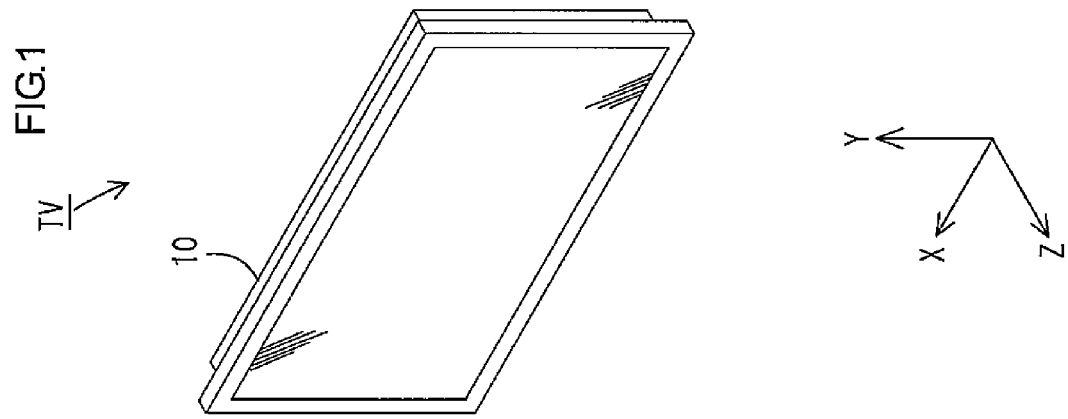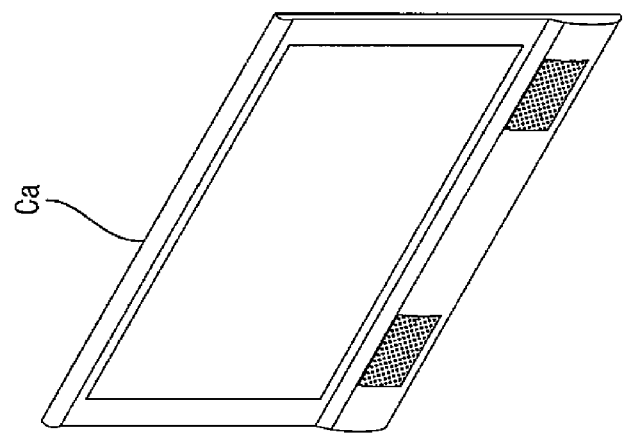
FIG.1

LIGHTING DEVICE, DISPLAY DEVICE, AND TELEVISION DEVICE

TECHNICAL FIELD

The present invention relates to a lighting device, a display device, and a television device.

BACKGROUND ART

A display panel used for a display device such as a liquid crystal television does not emit light, and thus a lighting device is generally provided. A direct type of lighting device and an edge-light type lighting device are known as the lighting devices used for such a display device. The direct type lighting device has light sources arranged behind a display panel. The edge-light device has light sources arranged at the edges of a display panel. The edge-light device converts light from the light sources to flat planer light by a light guide plate and emits the flat planer light toward the display panel. Each of the lighting devices includes a light source and a chassis. The chassis houses the light source and has an opening on the display panel side. An LED board may be used for the light source.

A direct type lighting device (Patent Document 1, for example) is configured such that a reflection member is arranged on a bottom plate of a chassis and an LED board is arranged on the rear side of the reflection member (between the chassis and the reflection member). The reflection member has holes through which LEDs project toward the front side. Spacers are arranged at multiple locations of the bottom plate of the chassis, and thus the spacers maintain a predetermined distance between the LED board and a diffuser plate that is arranged on the opening side of the chassis. The spacers project from the bottom plate of the chassis toward the front side. The spacers are in contact with the diffuser plate from the rear side of the diffuser plate. Each of the spacers has a stopper portion on a chassis side. Each stopper portion passes through the reflection member and the bottom plate of the chassis and stops at the rear side of the chassis. This fixes the spacer to the bottom plate of the chassis.

The edge-light type lighting device (Patent Document 2, for example) is configured such that a light guide plate is housed in a chassis and LED boards are arranged opposite the edges of the light guide plate. Spacers are arranged in areas of each LED board in which LEDs are not arranged. The spacers maintain a predetermined distance between the LED boards and the light guide plate. The spacers project longer than the LEDs and are in contact with the edges of the light guide plate. The spacers are fixed to each LED board with screws or adhesives.

Each of the lighting devices includes spacers to maintain a predetermined distance between the LED board and the optical member (the diffuser plate or the light guide member). Thus, uneven brightness is less likely to occur.

RELATED ART DOCUMENT

Patent Document

Patent Document 1: Japanese Unexamined Patent Application Publication No. 2008-166304
Patent Document 2: Japanese Unexamined Patent Application Publication No. 2010-92685

Problem to be Solved by the Invention

According to the configurations described above, the number of parts is increased by the spacers. A step for mounting the separate spacers on the chassis or the LED boards is required in the assembly process of the lighting devices. As the number of parts increases, the workability in the assembly processes of the lighting devices decrease.

Especially in a direct type lighting device, a large number of spacers are required for an entire surface of a bottom plate of the chassis. Mounting of all spacers to the bottom plate is time-consuming. Further, to remove the reflection member during disassembly of the lighting device, all the spacers need to be removed. Namely, the disassembly is also time-consuming. Furthermore, a large amount of force is required to alter a shape of a stopper portion of each spacer with elasticity during mounting and removal thereof. This may result in a decrease in workability.

In recent years, an increase in screen size of display devices has been remarkably progressing. If the number of spacers increases as the increase in screen size, workability in assembly or disassembly may further decrease. Solutions for such a problem are needed. Further, this problem may not be limited to lighting devices for display devices. Lighting devices including LED boards and optical members (diffuser plates or light guide members), such as indoor lighting device, may have the same problem.

DISCLOSURE OF THE PRESENT INVENTION

The present invention was made in view of the above circumstances. An object of the present invention is to provide a lighting device in which a predetermined distance between an LED unit and an optical member is maintained without increasing the number of parts, and to provide a display device and a television device including the same

Means for Solving the Problem

The lighting device according to the present invention includes a chassis, an LED, and an optical member. The chassis houses the LED unit. The LED unit includes an LED package and a printed circuit board. The LED package is mounted on the printed circuit board. The LED package includes an LED chip sealed therein and at least one spacer portion. The optical member is arranged opposite the LED package. The spacer portion is in contact with and maintains the optical member having a predetermined distance away from the LED package.

With the configuration, separate spacers are not required. Therefore, a predetermined distance between the LED unit and the optical member can be maintained without increasing the number of parts.

The LED package may include a light emitting portion and a base portion. The light emitting portion includes the LED chip sealed therein. The base portion extends over sides of the light emitting portion. The base portion is connected with the printed circuit board. The spacer portion may be arranged on the base portion.

The spacer portion may project from the LED package at an angle to an opposing surface of the optical member opposite the LED package.

The spacer portion may be elastically in contact with the opposing surface of the optical member at an angle to the opposing surface different from the angle at which the spacer portion projects.

With the configuration, the spacer portion is elastically angled according to the distance between the LED package and the optical member. Thus, the LED package need not be prepared for every lighting device having a different dimension in a front-rear direction.

The spacer portion may project from the LED package perpendicular to an opposing surface of the optical member. The opposite surface of the optical member is opposite the LED package.

The at least one spacer portion of the LED package may be a single spacer portion.

The at least one spacer portion of the LED package may include a plurality of spacer portions.

The plurality of spacer portions may be arranged symmetric about the light emitting portion.

The lighting device may be a lighting device for a display device including a display panel. The optical member may be arranged opposite the display panel. The LED unit may be arranged adjacent to a surface of the optical member opposite from a surface thereof facing the display panel.

The lighting device may be a lighting device for display device including a display panel. The optical member may be arranged opposite the display panel. The LED unit may be arranged adjacent to a side of the optical member that faces the display panel.

The display device according to the invention includes the lighting device and a display panel for providing display using light from the lighting device.

The display panel may be a liquid crystal panel using liquid crystals.

The television device according to the invention includes the display device.

Advantageous Effect of the Invention

According to the present invention, a lighting device in which a predetermined distance between the LED units and the optical member can be maintained without increasing the number of the parts, and a display device and a television device including the same can be provided.

BRIEF DESCRIPTION OF THE DRAWINGS

FIG. 1 is an exploded perspective view illustrating a general configuration of a television device according to the first embodiment of this invention.

MODE FOR CARRYING OUT THE INVENTION

<First Embodiment>

The first embodiment of the invention will be explained in detail with reference to FIG. 1 to FIG. 7. In this description, a television device TV including a liquid crystal display device (a display device) 10 will be used as an example.

As illustrated in FIG. 1, the television device TV of this embodiment includes the liquid crystal display device 10, cabinets Ca and Cb, a power source P, a stand S, and a tuner T for receiving TV broadcasting. The cabinets Ca and Cb sandwich, and thus house, the liquid crystal display device 10 from rear and front sides of the liquid crystal display device 10. The liquid crystal display device 10 arranged in a vertical position in the cabinets Ca and Cb with a display surface 11A in substantially a vertical direction. Hereinafter, a lower left side (a front side of the television device TV, the display surface 11A side, and a positive side of Z-axis direction) in FIG. 1 corresponds to a front side, an upper right side in FIG. 1 corresponds to a rear side, a upper side (a positive side of Y-axis direction) in FIG. 1 corresponds to an upper side, and a lower side in FIG. 1 corresponds to a lower side. Directions indicated in FIG. 1 correspond to each component in other drawings.

Figure 2:
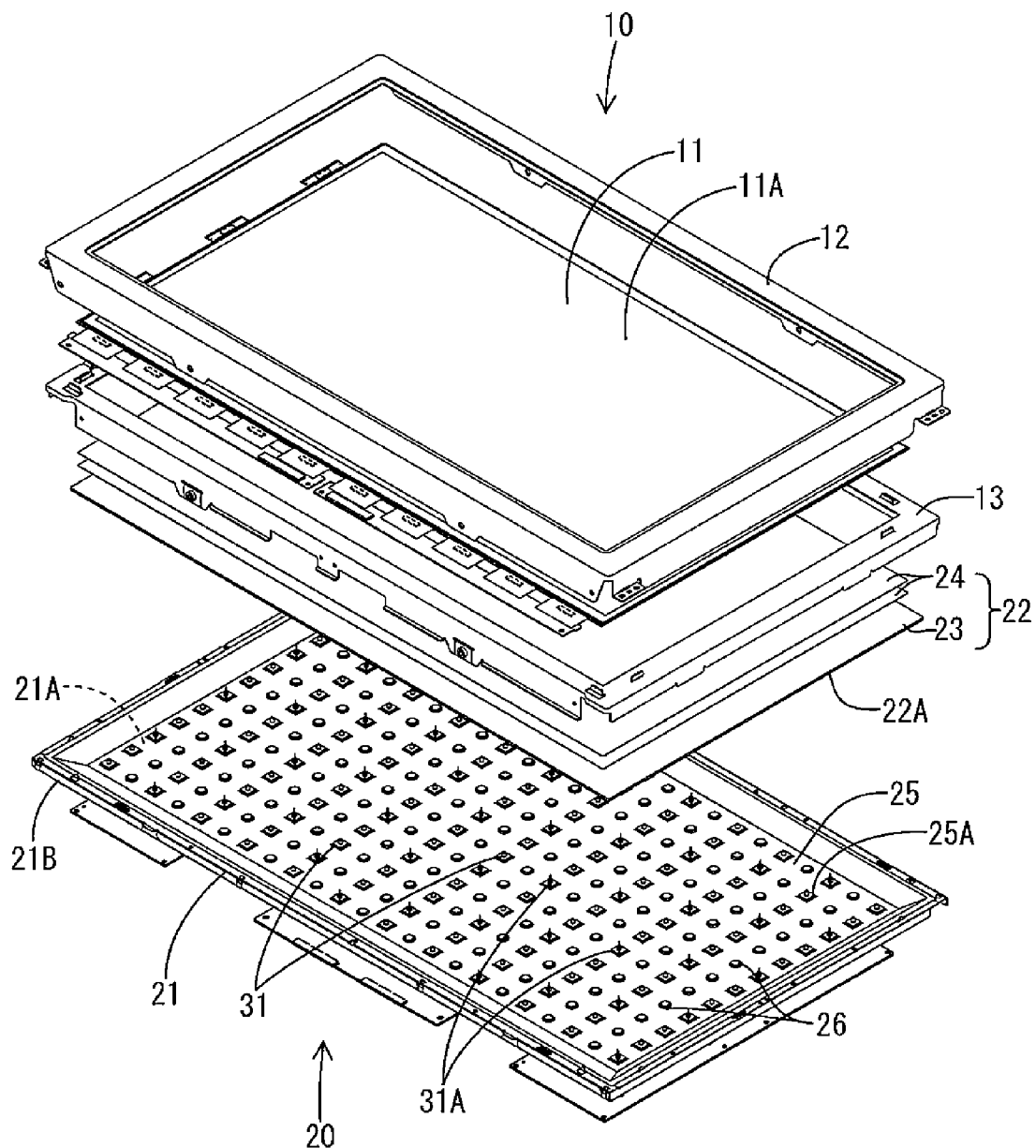
FIG. 2 is an exploded perspective view illustrating a general configuration of a liquid crystal display device.

As illustrated in FIG. 2, the liquid crystal display device 10 includes a liquid crystal panel (display panel) 11 and a lighting device for a display device (hereinafter, referred to as a lighting device 20) as an external light source. The liquid crystal panel 11 and the lighting device 20 are integrally held by a bezel 12 and the like. The liquid crystal display device 10 of this embodiment has a landscape rectangular shape as a whole. The liquid crystal display device 10 is used in a standing position. Namely, the display surface 11A of the liquid crystal panel 11 is arranged substantially parallel to the vertical direction.

The liquid crystal panel 11 includes a pair of glass substrates and liquid crystals. The glass substrates are bonded together with a predetermined gap therebetween. The liquid crystals are sealed between the glass substrates. On one of the glass substrates, switching components (for example, TFTs) connected to source lines and gate lines which are perpendicular to each other and pixel electrodes connected to the switching components are provided. On the other substrate, color filters having color sections such as R (red), G (green), and B (blue) color sections arranged in a predetermined pattern and counter electrodes are provided.

The lighting device 20 is a direct type lighting device, and includes a plurality of LED units 30 and a chassis 21. The LED units 30 are arranged behind the display surface 11A of the liquid crystal panel 11. The chassis 21 is made of a metal plate, and formed in a shallow box-shape having an opening on the front side (on the liquid crystal panel 11 side). The chassis 21 includes a bottom plate 21A and side plates 21B. The bottom plate 21A has a rectangular shape. The side plates 21B rise from respective outer edges of the bottom plate 21A.

An optical member 22 is arranged on the chassis 21 so as to be opposite the liquid crystal panel 11. The optical member 22 includes a diffuser plate 23 and an optical sheet 24. The diffuser plate 23 is provided on the rear side (the chassis 21 side) and the optical sheet 24 is arranged on the front side of the diffuser plate 23. The diffuser plate 23 includes a base member made of a transparent synthetic resin and light scattering particles dispersed in the base member. The diffuser plate 23 has a function for diffusing light that traveling therethrough. The optical sheet 24 is formed in a sheet having a thickness smaller than that of the diffuser plate 23. The optical sheet 24 may be selected from a diffuser sheet, a lens sheet, and a reflecting type polarizing sheet, whatever is appropriate.

The optical member 22 is formed in a rectangular shape in a plan view. Outer edges of the optical member 22 are placed on the front sides of the side plates 21B so as to cover the opening of the chassis 21. The optical member 22 is sandwiched, and thus held, between a frame 13 made of a metal and the chassis 21. The frame 13 is formed in a frame shape along the outer edges of the optical member 22. An outer peripheral part of the liquid crystal panel 11 is placed on the front side of the frame 13. The bezel 12 is fixed to the front side of the frame 13 with screws such that the frame 13 and the bezel 12 hold the outer peripheral part of the liquid crystal panel 11 therebetween.

Figure 4:
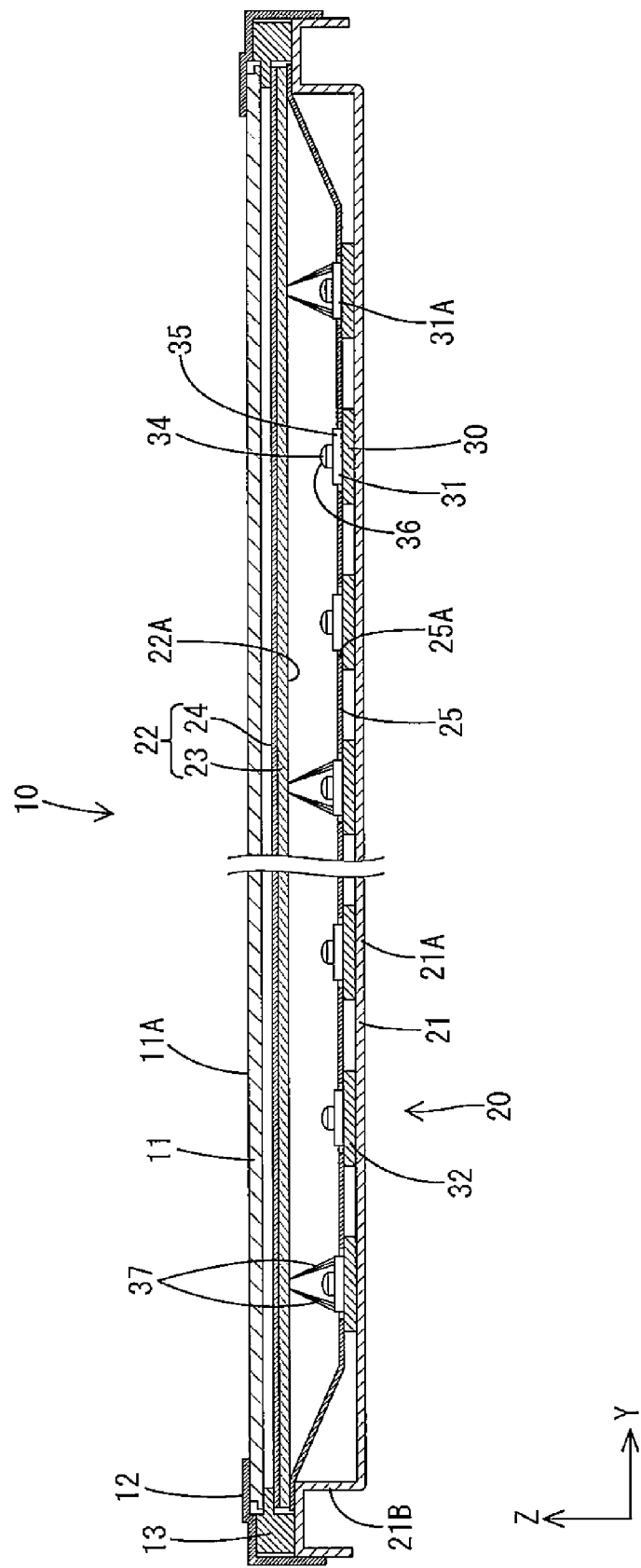
FIG. 4 is a cross-sectional view of the lighting device taken along a line A-A in FIG. 3.

A reflection sheet 25 is arranged at an inner surface of the bottom plate 21A of the chassis 21 (see FIG. 4). The reflection sheet 25 is made of a synthetic resin, and has a surface having white color that provides high light reflectivity. The reflection sheet 25 covers almost entire inner surfaces of the chassis 21, forming wall surfaces (light reflection surfaces) in the chassis 21. A peripheral part of the reflection sheet 25 rises at an angle to the side plates 21B of the chassis 21 so as to cover the inner surfaces of the side plate 21B.

The plurality of LED units 30 are housed in the chassis 21. The LED units 30 are arranged adjacent to a surface of the optical member 22 from a surface thereof facing the liquid crystal panel 11.

Each of the LED units 30 has an elongated rectangular shape as a whole. Each LED unit 30 includes a printed circuit board 32 and LED packages 31. The LED packaged 31 includes LED chips sealed therein (not illustrated). The LED packages 31 are mounted on the printed circuit board 32.

The printed circuit board 32 includes a substrate and a wiring pattern formed on the substrate. The printed circuit board 32 may be prepared with an insulation substrate made of a synthetic resin (a glass epoxy resin) or a ceramic material, and a wiring pattern made of a metallic layer such as a cooper foil. Alternatively, the printed circuit board 32 may be prepared with a metal substrate made of an aluminum material, and a wiring pattern formed on the substrate placing an insulation layer therebetween.

The LED package 31 is a point light source. The plurality of LED packages 31 are arranged along a long-side direction of the printed circuit board 32 at substantially regular intervals.

Each of the LED packages 31 includes the LED chip and a package body 33. In the package body 33, a cavity (not illustrated) and a circuit pattern (not illustrated) are formed. The LED chip is fitted to the cavity and electrically connected to the circuit pattern. A transparent resin such as an epoxy resin or a silicon resin seals the LED chip and this completes the LED package 31. The package body 33 is injection-molded from an insulation material.

Figure 5:
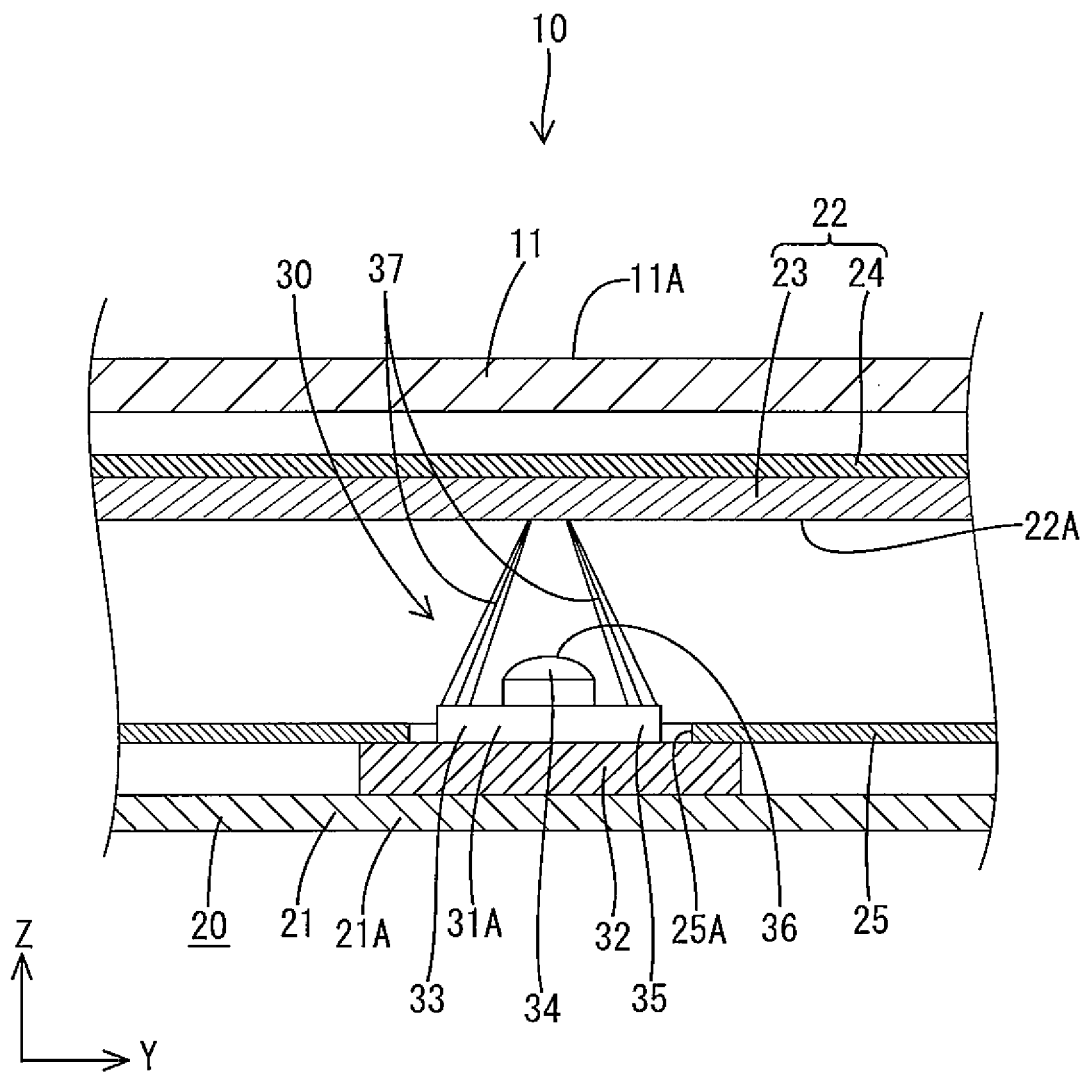
FIG. 5 is a partial, magnified cross-sectional view of the lighting device illustrating a spacer portion being in contact with an optical member.
Figure 6:
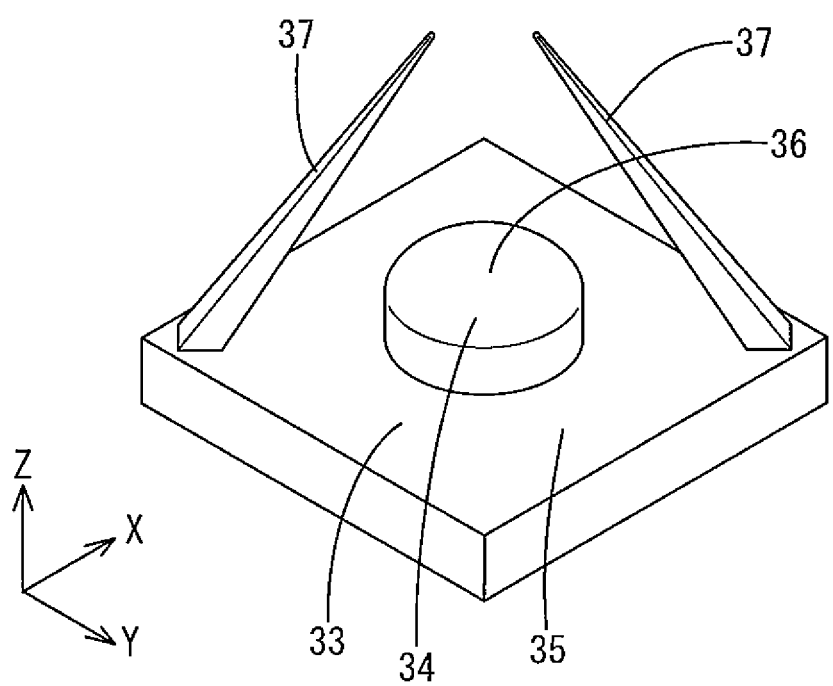
FIG. 6 is a perspective view illustrating a general configuration of an LED package with spacers.
Figure 7:
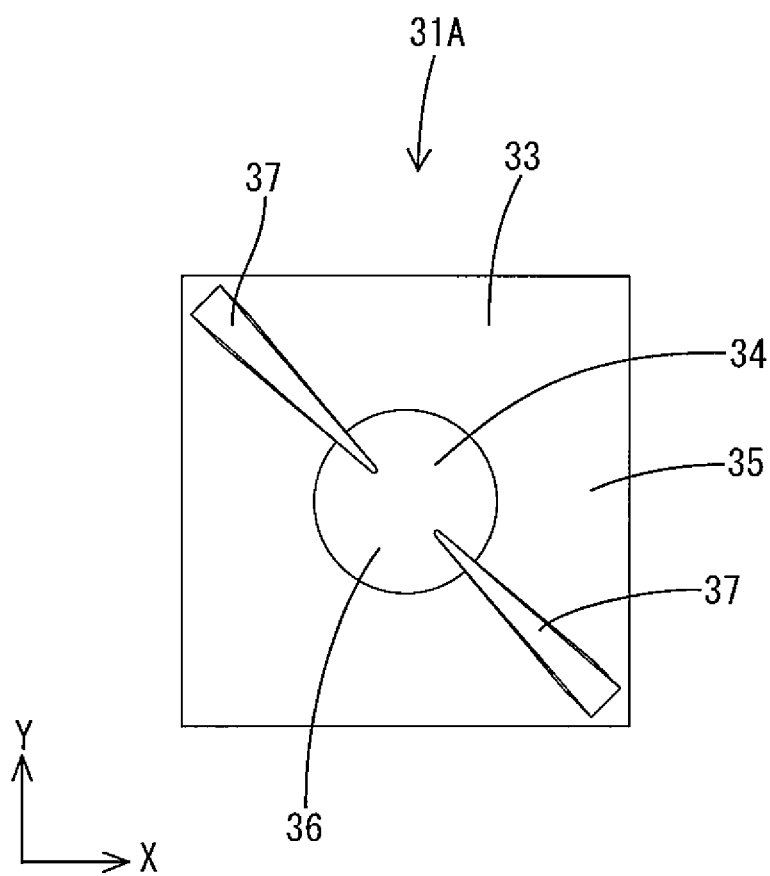
FIG. 7 is a plan view illustrating a general configuration of an LED package with spacers.

As illustrated in FIG. 5, each of the LED packages 31 includes a base portion 35 and a light emitting portion 34 in which the LED chip is sealed. The base portion 35 extends over sides of the light emitting portion 34, forming a rectangular plate-like shape in a plan view. The base portions 35 are arranged along the printed circuit board 32 and connected thereto. The light emitting portion 34 locates around a center of a surface of the base portion 35 and projects in a dome-like shape. A light emitting surface 36 (a light emitting surface) is a front side surface of the light emitting portion 34 (a surface opposite a surface mounted to the printed circuit board 32) in the LED package 31. The LED chip has a light emission wavelength. Specifically, the LED chip that emits a single color of blue is used. On the other hand, a fluorescent material is dispersed in the resin material that seals the LED chip therein. The fluorescent material converts the blue light emitted from the LED chip into white light. This enables the LED package 31 to emit white light.

The LED package 31 has spacer portions 37. The spacer portions 37 are in contact with and maintain the optical member 22 having a predetermined distance away from the LED package 31.

Each of the spacer portions 37 is made of a transparent resin and integrated with the LED package 31. Specifically, the spacer portion 37 may be formed when the package body 33 is injection-molded, or may be integrated with the package body 33 by bonding, press-fitting, or crimping, whatever is appropriate.

Each LED package 31 (see FIG. 6) includes a pair of the spacer portions 37. Each spacer portion 37 has three of side surfaces. Each side surface has a narrow triangular shape having a tip end. The pair of the spacer portions 37 positions at diagonally opposite corners among the four corners of the base portion 35. Specifically, the pair of the spacer portions 37 is arranged symmetric about the center of the light emitting portion 34. The spacer portions 37 obliquely project toward the center (toward a diagonal directions of the base portion 35) of the base portion 35 (see FIG. 7) in a front direction. The tip end of each spacer portion 37 extends close to but not exceeds the center of the light emitting portions 34. Each spacer portion 37 in pairs has almost a same size and a same shape each other, having a central symmetric shape from the center of the light emitting portion 34. The LED units 30 are fixed to the chassis 21 with the spacer portions 37 being at an angle to an opposing surface 22A of the optical member 22. The opposing surface 22A is opposite the LED packages 31. The spacer portion 37 is elastically in contact with the opposing surface 22A of the optical member 22 at an angle to the opposing surface 22A different from the angle at which the spacer portion projects. Namely, the spacer portions 37 are elastically angled to a direction in which a distance between the spacer portions 37 and the base portion 35 decreases.

Figure 3:
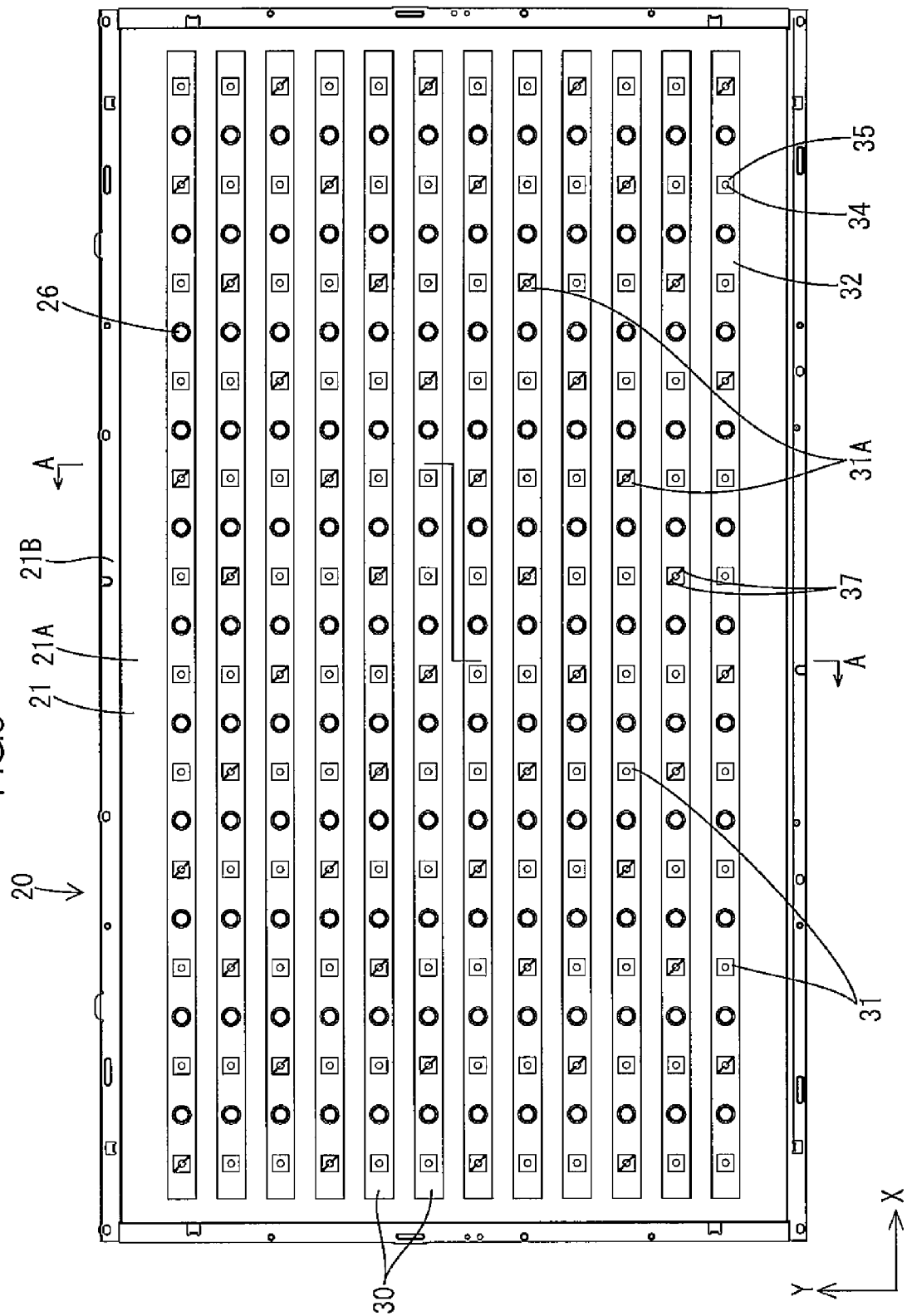
FIG. 3 is a plan view of a lighting device illustrating an arrangement of LED units.

The lighting device 20 includes a plurality of types of LED units 30 (see FIG. 3). In the embodiment, three types of LED units 30 are provided. As illustrated in FIG. 3, each type of the LED units 30 includes the LED packages 31 having the spacer portions 37 (hereinafter referred to as an LED package with spacers 31A) at different positions. Specifically, in each type of the LED units 30, the LED packages with spacers 31A are differently arranged along the long-side direction of the printed circuit board 32. The LED units 30 are arranged in the chassis 21 at regular intervals. In the chassis 21, long sides of the LED units 30 correspond to the long side direction of the chassis 21, and short sides thereof correspond to the short-side direction of the chassis 21 (twelve columns in the embodiment). The three types of the LED units 30 are alternatively arranged on the almost bottom plate 21A of the chassis 21 along the short side of the chassis 21 so as to balance the layout of LED packages with spacers 31A. The LED units 30 are arranged on the rear side of the reflection sheet 32. The LED packages 31 of the LED units 30 project from openings 25A that are formed in the reflection sheet 25. Each LED unit 30 is fixed to the bottom plate 21A of the chassis 21 by holding members 26. The holding members 26 pass through the printed circuit board 32 and the bottom plate 21A of the chassis 21, and stop at the rear side of the bottom plate 21A of the chassis 21.

The first embodiment with the configuration above has following effects. The lighting device 20 in the embodiment is the lighting device 20 for the liquid crystal display device 10 including the liquid crystal panel 11. The lighting device 20 includes the chassis 21, the LED units 30, and the optical member 22. The chassis 21 is opened to the liquid crystal panel 11 side. The chassis 21 houses the LED units 30. Each LED unit 30 includes the printed circuit board 32 and the LED package 31. The LED package 31 is mounted on the printed circuit board 32. The LED package 31 includes the LED chip sealed therein and the spacer portion 37. The optical member 22 is arranged opposite the LED package 31. The spacer portion 37 is in contact with and maintains the optical member 22 having the predetermined distance away from the LED package 31. This eliminates a need for separate spacers unlike conventional devices. Therefore, the predetermined distance between the LED unit 30 and the optical member 22 can be maintained without increasing the number of parts.

During assembly of the lighting device 20, the spacer portions 37 are provided to the lighting device 20. The LED packages with spacers 31A are mounted on the LED units 30. The LED units 30 are mounted on the bottom plate 21A of the chassis 21. Unlike conventional devices, this eliminates a step of mounting separate spacers to the chassis. Thus, the workability in assembly process of the lighting device 20 can be enhanced. Further, unlike the conventional devices, spacer holes through which spacers are inserted are not necessary at the bottom plate 21A of the chassis 21. Therefore, the chassis 21 can be easily manufactured. Furthermore, unlike the conventional devices, spacers need not to be removed during disassembly of the lighting device 20. Therefore, the workability in disassembly process can be enhanced.

The spacer portion 37 is elastically in contact with the optical member 22 at an angle to the opposing surface 22A different from the angle at which the spacer portion 37 projects. The spacer portion 37 is elastically angled according to the distance between the LED package 31 and the optical member 22. Thus, the LED package with the spacers 31A need not be prepared for every lighting device having a different dimension in the front-rear direction (thickness).

<Second Embodiment>

Figure 8:
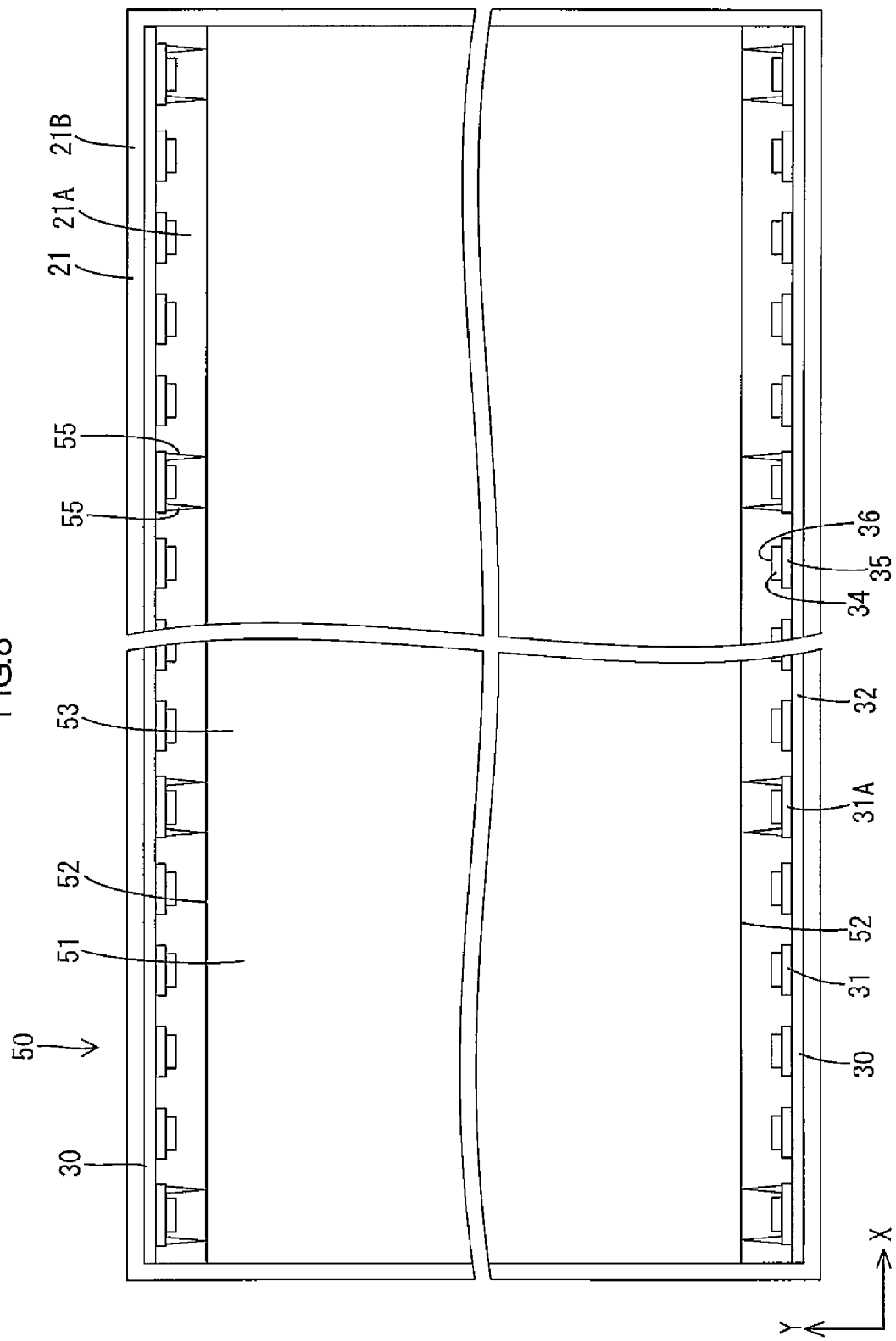
FIG. 8 is a plan view of a lighting device according to the second embodiment illustrating an arrangement of LED units.
Figure 9:
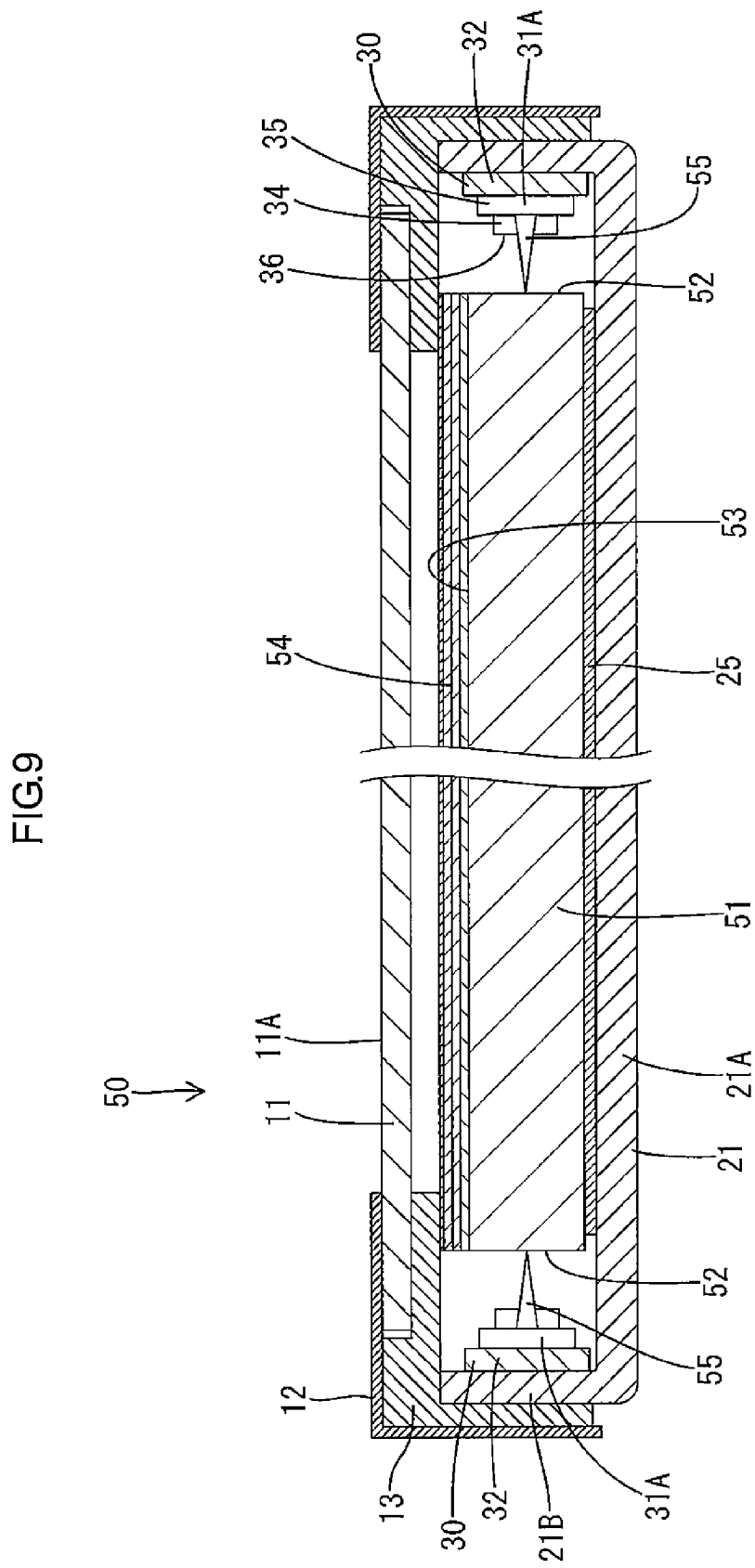
FIG. 9 is a cross-sectional view of the lighting device illustrating a spacer portion in contact with a light guide plate.

A lighting device 50 according to the second embodiment of the invention will be explained with reference to FIG. 8 and FIG. 9. The second embodiment differs from the first embodiment in the configuration of the lighting type. An edge-light type (a side light type) lighting device is used in the lighting device 50. A light guide plate 51 (optical member) is arranged opposite the liquid crystal panel 11. The LED units 30 are arranged adjacent to sides of the liquid crystal panel 11 (sides of light guide plate that faces the liquid crystal panel 11). The same configurations as those in the first embodiment will be indicated by the same symbols and will not be explained.

The lighting device 50 in the second embodiment, same as the above-described first embodiment, includes the chassis 21 and the frame 13. The chassis 21 is opened to the liquid crystal panel 11 side. The frame 13 is arranged along the outer periphery of the chassis 21. The chassis 21 houses the light guide plate 51 and the LED units 30. The light guide plate 51 is arranged opposite the liquid crystal panel 11, and the LED units 30 is arranged adjacent to sides (hereinafter referred to as a light entrance surface 52) of the light guide member 51.

Light emitted from the LED units 30 is converted to flat planar light by the light guide member 51, and the light exits toward the liquid crystal panel 11.

The light guide plate 51 is made of a resin having a high light transmissivity (high transparency) such as an acrylic resin. The light guide plate 51 has a shape of a rectangular plate in a plan view and has a same thickness throughout the plate. The light guide plate 51 repeatedly reflects the light that entered from the light entrance surface 52 and disperses the light inside the light guide plate 51. Then, the light guide plate 51 converts the light to flat planer light and directs the flat planer light toward a main plate surface (referred to as a light exit surface 53). The light guide plate 51 is housed in the chassis 21 such that the light exit surface 53 faces the front side and a rear surface of light guide plate 51 faces along the bottom plate 21A of the chassis 21.

The reflection sheet 25 is arranged on the rear surface (back surface) of the light guide plate 51. The reflection sheet 25 reflects the light exited from the light guide plate 51 into the light guide plate 51 again. Same as the above-described first embodiment, the reflection sheet 25 is made of a synthetic resin and has a surface having white color that provides high light reflectivity. The reflection sheet 25 is arranged between the light guide plate 51 and the bottom plate 21A of the chassis 21 such that the reflection sheet 25 covers the almost entire area of the light guide plate 51.

Optical sheets 54 layer on the light exit surface 53 of the light guide plate 51. The optical sheets 54 convert the light passed through the light guide plate 51 to flat planer light. The optical sheets 54 include a diffuser sheet, a lens sheet, and a reflection-type polarizing plate.

Each of the LED units 30 has an elongated shape as a whole, and includes the LED packages 31 and the printed circuit board 32 same as the first embodiment. Each LED package 31 includes LED chip (not illustrated) sealed therein. The LED package 31 is mounted on the printed circuit board 32. The LED units 30 are arranged along long edges (an upper end portion and a lower end portion) of the peripheral part of the chassis 21 that are extended along a longitudinal direction. Accordingly, the LED units 30 are positioned between the light guide plate 51 and the side plates 21B of the chassis 21. The LED units 30 are arranged the such that the board surface of the printed circuit boards 32 and the light emitting surface 36 are opposite the entrance surface 52 (opposite surface from the LED packages 31) of the light guide plate 51. The LED units 30 are fixed to the side plates 21B of the chassis 21 with screws (not illustrated).

The LED packages 31 have spacer portions 55. Each of the spacer portions 55 is in contact with and maintains the light guide plate 51 having a predetermined distance away from the LED packages 31. The spacer portion 55 is made of a transparent resin and integrated with the LED package 31 same as the first embodiment. A pair of spacer portions 55 is provided to each LED package 31 and each spacer portion 55 projects from the base portion 35 same as the first embodiment. The pair of each spacer portion 55 has almost a same size and a same shape each other, having a central symmetric shape from the center of the light emitting portion 34, same as the first embodiment. Each of the spacer portion 55 projects toward a direction perpendicular to the surface of the base portion 35. Each spacer portion 55 is in a shape of which width decreases (sharpened) as if close to the tip end. The LED unit 30 is fixed to the chassis 21 with spacer portion 55 being perpendicular to the light entrance surface 52 of the light guide plate 51.

According to the above embodiment, each LED package 31 includes the spacer members 55 that is in contact with and maintains the light guide plate 51 having the predetermined distance away from the LED package 31. This eliminates a need for separate spacers, same as the first embodiment. Therefore, the predetermined distance between the LED unit 30 and the light guide plate 51 can be maintained without increasing the number of parts.

<Other Embodiments>

The invention is not limited to the above embodiments described in the above description and the drawings. The following embodiments are also included in the technical scope of the present invention, for example.

Figure 10:
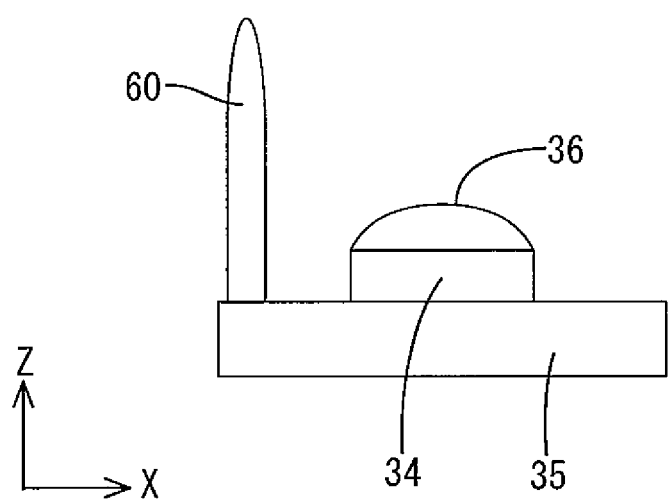
FIG. 10 is a side view illustrating a general configuration of an LED package with a spacer according to the other embodiment (1).

(1) The above embodiments include the LED package 31 having the pair of the spacer portions 37 (55). However, the present invention is not limited thereto. Each LED package 31 may include a single spacer portion 60 as illustrated in FIG. 10.

Figure 11:
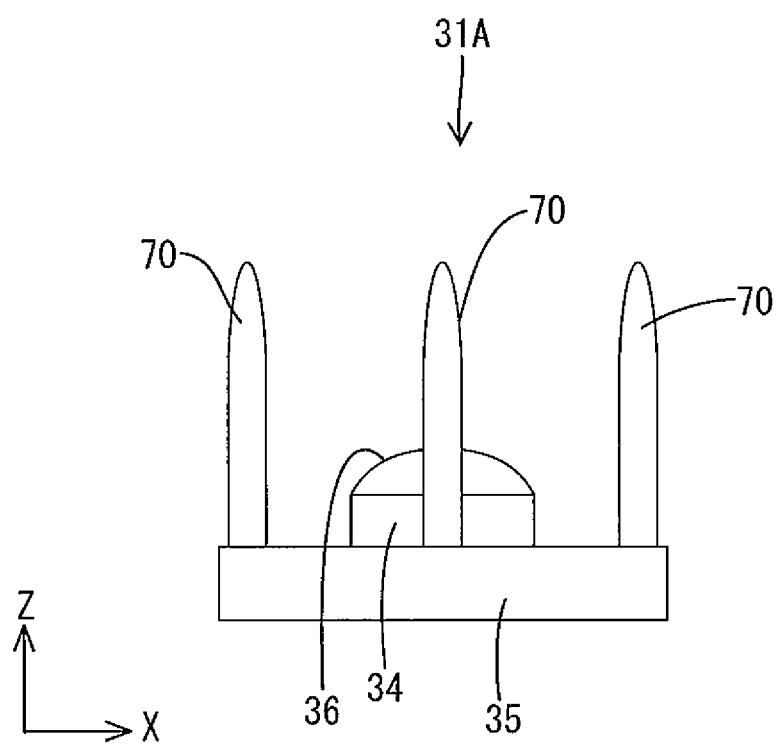
FIG. 11 is a side view illustrating a general configuration of an LED package with spacers according to the other embodiment (2).

(2) The above embodiments include the LED package 31 having the pair of the spacer portions 37 (55). However, the present invention is not limited thereto. Each LED package 31 may have three or more spacer portions 70 as illustrated in FIG. 11.

Figure 12:
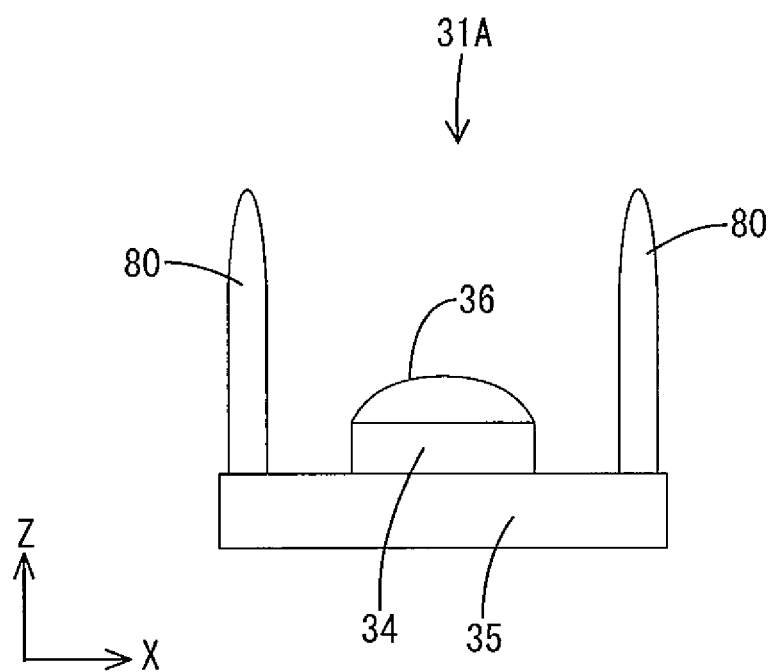
FIG. 12 is a side view illustrating a general configuration of an LED package with spacers according to the other embodiment (3).

(3) The first embodiment includes spacer portions 37 that obliquely project from the base portion 35. However, the present invention is not limited thereto. Each spacer portion 80 may perpendicularly project from the base portion 35 as illustrated in FIG. 12.

Figure 13:
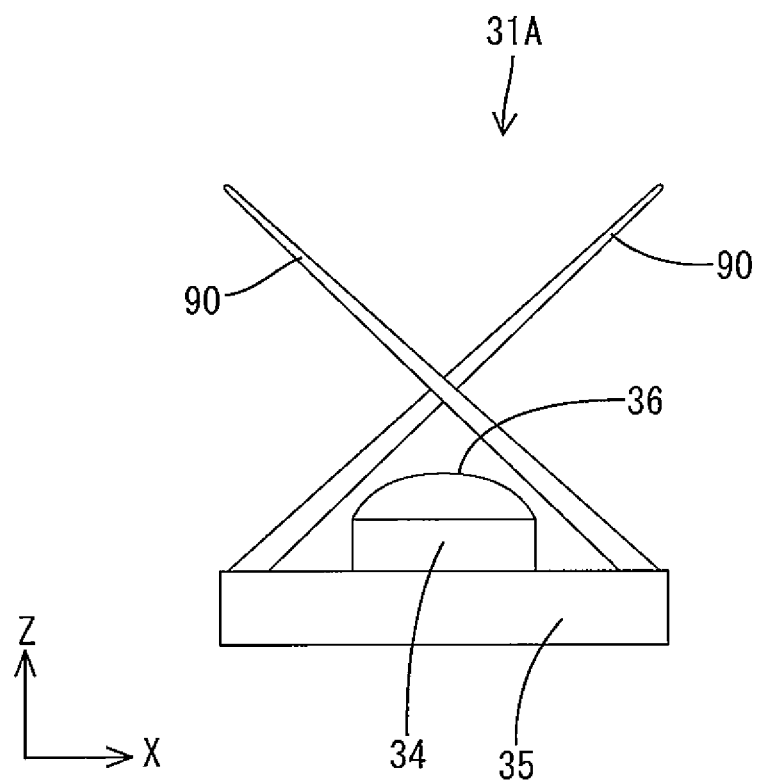
FIG. 13 is a side view illustrating a general configuration of an LED package with spacers according to the other embodiment (4).

(4) The first embodiment includes spacer portions 37 that obliquely project from the corners toward the center (toward the diagonal directions of the base portion 35) of the base portion 35. The tip ends of the spacer portions 37 are located at the front side of the light emitting portion 34. However, the present invention is not limited thereto. Spacer portions 90 may obliquely project from the corners of the base portion 35 and the tip ends may cross each other as illustrated in FIG. 13. Further, the spacer portions 90 may obliquely project from the corners of the base portion 35 along sides (outer peripheral edges) of the base portion 35.

Figure 14:
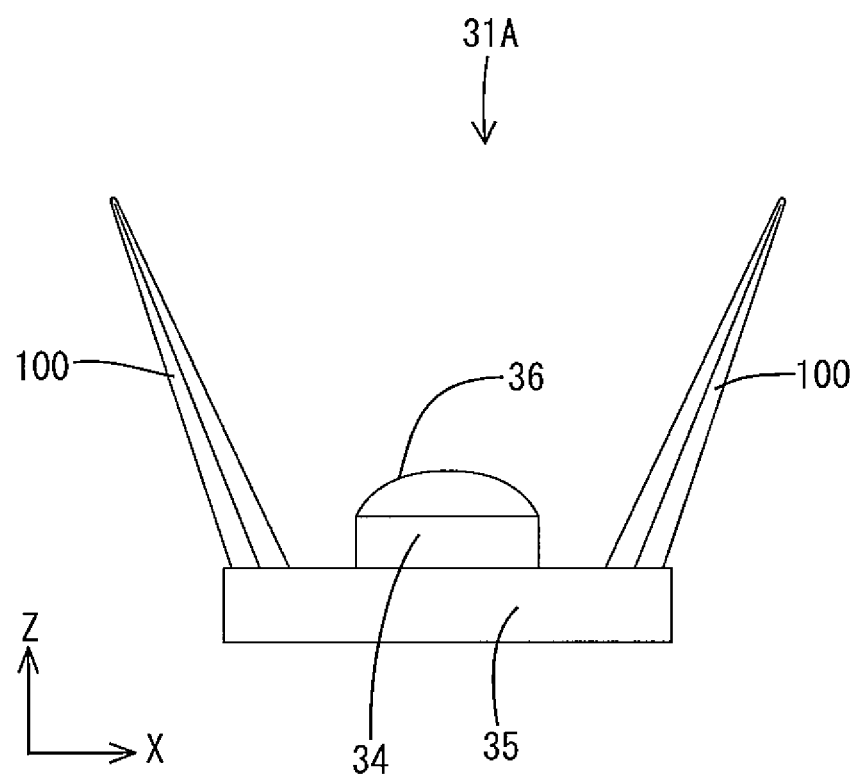
FIG. 14 is a side view illustrating a general configuration of an LED package with spacers according to the other embodiment (5).

(5) The first embodiment includes spacer portions 37 that obliquely project from the corners toward the center of the base portion 35. However, the present invention is not limited thereto. Each spacer portions 100 may project away from the base portion 35 as illustrated in FIG. 14.

(6) The first embodiment includes the spacer portions 37 that are elastically in contact with the opposing surface 22A of the optical member 22 at angles to the opposing surface 22A different from the angles at which the spacer portions 37 project. The spacer portions 37 change the shapes to the direction in which the inclination of the spacer portions 37 changes with respect to the opposing surface 22A. However, the present invention is not limited thereto. An angle adjustment mechanism may be provided to adjust the angle of the spacer portion between an elementary part of the spacer portion and the base portion. The angle adjustment mechanism may have a shaft and a hole such that the spacer portion can rotate. The angle adjustment mechanism may have a spring that controls the rotation of the spacer portion within a predetermined range.

(7) The first embodiment includes the lighting device 20 for the display device that supplies light to the liquid crystal panel 11. However, the present invention is applicable to an indoor lighting device, for example. Specifically, the lighting device illustrated in FIG. 4 can be used as an indoor lighting device if the lighting device without the liquid crystal panel 11 is attached on a ceiling.

Explanation of Symbols

TV: television device, 10: liquid crystal display device (display device), 11: liquid crystal panel (display panel), 20, 50: lighting device for a display device, 21: chassis, 22: optical member, 22A: opposing surface of the optical member, 30: LED unit, 31: LED package, 32: printed circuit board, 34: light emitting portion, 35: base portion, 37, 55, 60, 70, 80, 90, 100: spacer portion, 51: light guide plate (optical member), 52: light entrance surface (surface opposite the optical member)

The invention claimed is:

1. A lighting device comprising:
    a chassis;
    an LED unit housed in the chassis and including an LED package, a printed circuit board, and at least one spacer portion; and
    an optical member including an opposing surface, wherein
    the LED package includes and LED chip and is mounted on the printed circuit board such that the LED package is opposite to the opposing surface of the optical member and located a predetermined distance away from the optical member;
    the at least one spacer portion projects from the LED package in a projecting direction such that an axis of the spacer portion in the projecting direction is oblique to the opposing surface of the optical member;
    the at least one spacer portion is in contact with the optical member to maintain the Predetermined distance between the LED package and the optical member; and
    the LED package and the at least one spacer portion are integrally formed as a unitary single part.

2. The lighting device according to claim 1, wherein
    the LED package includes a light emitting portion and a base portion, the light emitting portion including the LED chip sealed therein, the base portion extending over sides of the light emitting portion and being connected with the printed circuit board, and
    the at least one spacer portion from the base portion.

3. The lighting device according to claim 1, wherein the at least one spacer portion is elastically in contact with the opposing surface of the optical member at an angle to the opposing surface different from the angle at which the at least one spacer portion projects.

4. The lighting device according to claim 1, the at least one spacer portion of the LED package is a single spacer portion.

5. The lighting device according to claim 1, the at least one spacer portion includes a plurality of spacer portions.

6. The lighting device according to claim 5, the plurality of spacer portions are arranged symmetric about the light emitting portion.

7. The lighting device according to claim 1, wherein
    the lighting device is a lighting device for a display device including a display panel,
    the optical member is arranged opposite the display panel, and
    the LED unit is arranged adjacent to a surface of the optical member opposite from a surface thereof facing the display panel.

8. The lighting device according to claim 1, wherein
    the lighting device is a lighting device for display device including a display panel,
    the optical member is arranged opposite the display panel, and
    the LED unit is arranged adjacent to a side of the optical member that faces the display panel.

9. A display device comprising:
    the lighting device according to claim 1; and
    a display panel for providing display using light from the lighting device.

10. The display device according to claim 9, wherein the display panel is a liquid crystal panel using liquid crystals.

* * * * *